US012695272B2

(12) United States Patent
Mugnier

(10) Patent No.: US 12,695,272 B2
(45) Date of Patent: Jul. 28, 2026

(54) TUNABLE LASER HAVING LOW INTRA-CAVITY CHROMATIC ABERRATIONS

(71) Applicant: EXFO Optics, SAS, Lannion (FR)

(72) Inventor: Alain Mugnier, Penvénan (FR)

(73) Assignee: EXFO Optics, SAS, Lannion (FR)

( * ) Notice: Subject to any disclaimer, the term of this patent is extended or adjusted under 35 U.S.C. 154(b) by 658 days.

(21) Appl. No.: 18/112,006

(22) Filed: Feb. 21, 2023

(65) Prior Publication Data

US 2023/0268719 A1     Aug. 24, 2023

Related U.S. Application Data

(60) Provisional application No. 63/313,362, filed on Feb. 24, 2022.

(51) Int. Cl.
*H01S 5/14*          (2006.01)
*H01S 5/02253*     (2021.01)

(52) U.S. Cl.
CPC .......... *H01S 5/143* (2013.01); *H01S 5/02253* (2021.01)

(58) Field of Classification Search
CPC .. H01S 5/143; H01S 5/02253; H01S 5/02251; H01S 3/08; H01S 5/141
See application file for complete search history.

(56) References Cited

U.S. PATENT DOCUMENTS 5,161,040 A    11/1992  Yokoyama et al.
5,325,378 A     6/1994  Zorabedian 5,327,447 A     7/1994  Mooradian
5,392,308 A     2/1995  Welch et al.
(Continued)

FOREIGN PATENT DOCUMENTS

CA          2290208 A1     5/2000
CN        105655870 A      6/2016
(Continued)

OTHER PUBLICATIONS

Machine Translation of JP 1993206579, publication date Aug. 13, 1993, Nishimura (Year: 1993).*

(Continued)

*Primary Examiner* — Jessica S Manno
(74) *Attorney, Agent, or Firm* — Baratta Law PLLC; Lawrence A. Baratta, Jr.

(57)                ABSTRACT

There is provided a tunable external-cavity laser and a tunable laser source based on such tunable external-cavity laser. The tunable external-cavity laser comprises: two reflective surfaces to form a laser cavity therebetween; an active waveguide for amplifying laser light propagating in the laser cavity; a tunable wavelength-selective filter within the laser cavity for selecting the emission wavelength of the tunable external-cavity laser with in a tuning range; and a collimating lens system for collimating the optical beam out of the active waveguide for propagation in the laser cavity. The collimating lens system comprises an imaging lens and a collimating lens for collimating the optical beam. The imaging lens induces a positive chromatism within the tuning range and the collimating lens comprises a complex lens inducing a negative chromatism within the tuning range so as to at least partially compensate for the positive chromatism induced by the imaging lens.

18 Claims, 11 Drawing Sheets

(56) References Cited

U.S. PATENT DOCUMENTS

| | | | | |
|---|---|---|---|---|
| 5,537,432 | A * | 7/1996 | Mehuys | G02B 6/305 |
| | | | | 372/50.11 |
| 5,886,785 | A | 3/1999 | Lefevre et al. | |
| 6,256,328 | B1 * | 7/2001 | Delfyett | H01S 5/065 |
| | | | | 372/18 |
| 6,507,597 | B1 * | 1/2003 | Graindorge | H01S 5/141 |
| | | | | 372/20 |
| 6,754,243 | B2 | 6/2004 | Missey et al. | |
| 6,785,305 | B1 | 8/2004 | Gabbert et al. | |
| 6,788,473 | B2 | 9/2004 | Kim et al. | |
| 7,061,957 | B2 | 6/2006 | Baney | |
| 7,873,081 | B1 | 1/2011 | Gao | |
| 7,918,555 | B2 | 4/2011 | Sverdrup et al. | |
| 8,023,549 | B2 | 9/2011 | Miyata et al. | |
| 8,179,594 | B1 | 5/2012 | Tidwell et al. | |
| 8,300,326 | B2 | 10/2012 | Genet et al. | |
| 10,890,743 | B2 | 1/2021 | Dohi | |
| 2003/0174619 | A1 | 9/2003 | Itonaga | |
| 2005/0190811 | A1 | 9/2005 | Gruhlke | |
| 2009/0238217 | A1 * | 9/2009 | Moser | H01S 5/141 |
| | | | | 372/20 |
| 2020/0257110 | A1 | 8/2020 | Owen | |
| 2020/0384572 | A1 | 12/2020 | Tzankov et al. | |
| 2023/0208104 | A1 * | 6/2023 | Tamagnone | H01S 5/141 |
| | | | | 372/20 |

FOREIGN PATENT DOCUMENTS

| | | |
|---|---|---|
| EP | 2273630 B1 | 1/2012 |
| JP | H05206579 A | 8/1993 |
| JP | 2007189118 A | 7/2007 |
| WO | 2015018352 A1 | 2/2015 |
| WO | 2020018160 | 1/2020 |

OTHER PUBLICATIONS

Dr. Rudiger Paschotta, External-cavity diode lasers, ECDL, RP Photonics Encyclopedia, [retrieved on Aug. 4, 2021] Retrieved from the Internet: <URL: www.rp-photonics.com/external_cavity_diode_lasers.html>.

* cited by examiner

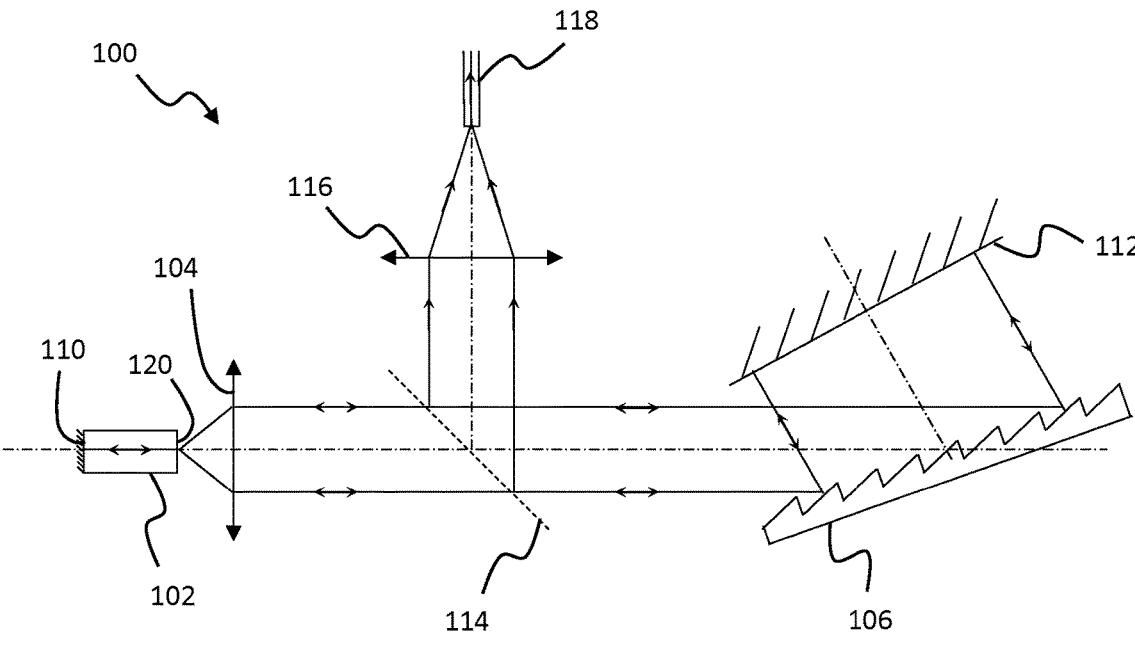
Fig. 1 – Prior Art
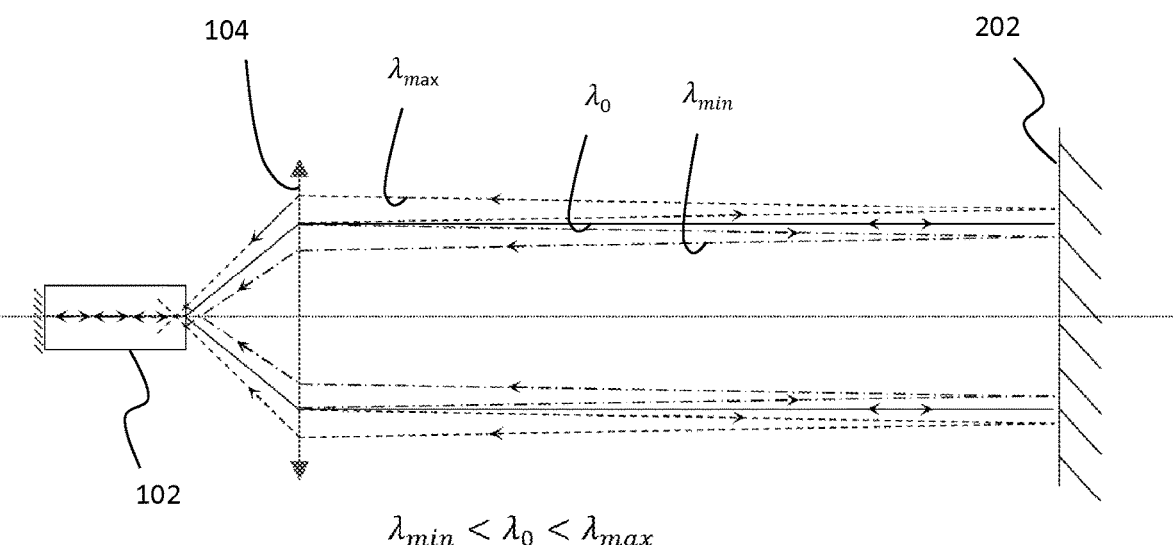
$$\lambda_{min} < \lambda_0 < \lambda_{max}$$
Fig. 2

$$\lambda_{min} < \lambda_0 < \lambda_{max}$$

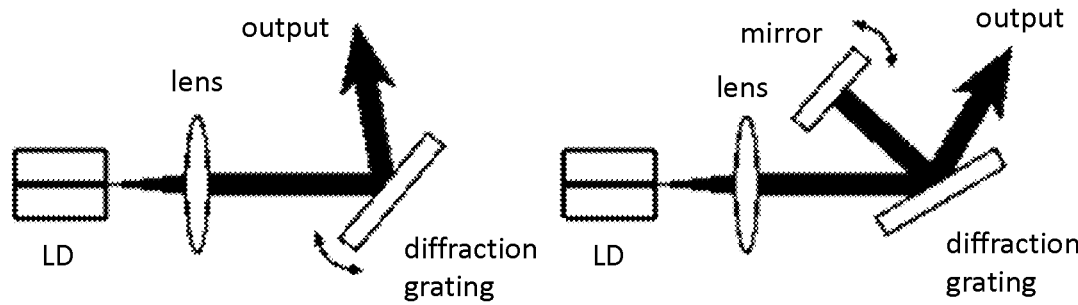
Littrow configuration          Littman-Metcalf configuration
Fig. 7A –          Fig. 7B –
Prior Art          Prior Art
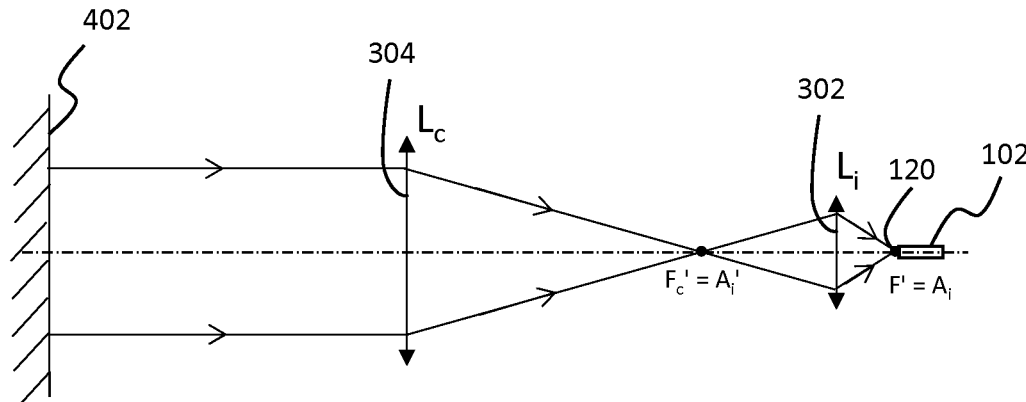
Fig. 8

TUNABLE LASER HAVING LOW INTRA-CAVITY CHROMATIC ABERRATIONS

TECHNICAL FIELD

The present description generally relates to tunable laser sources, and more particularly to tunable laser sources based on tunable external-cavity laser technology.

BACKGROUND

A tunable laser is a laser which emission wavelength can be tuned. Most laser diodes can be tuned over a few nanometers by varying the junction temperature, but other technologies are needed in order to provide a wider tuning range (e.g., more than 10 nm). External-cavity diode lasers can be used for that purpose. An external-cavity diode laser is a diode laser based on a laser diode chip which is integrated into a larger resonator cavity (also referred to herein as the "laser cavity" or simply "cavity"). Tunability is typically obtained by including a diffraction grating within this laser resonator cavity, which is used as the wavelength-selective element.

Tunable lasers are generally expected to be continuously tunable over a wide tuning range and to produce a single-frequency continuous emission with maximum power over the entire tuning range.

In the case of a wide tuning range (e.g., more than 100 nm) it was found that prior art tunable external-cavity diode lasers often have some limitations at extremities of the tuning range. First, the laser gain decreases at such extremities and second, chromatic effects, and more specifically, chromatic aberrations caused by the collimating lens, accentuate loss in the laser cavity. These limitations reduce laser efficiency attuning edges and can produce multi-longitudinal-mode operation.

Ideally, to mitigate this problem, the collimating lens should be made achromatic. However, characteristics of the collimating lens (such as its short focal distance) often make it unsuitable for an achromatic design.

In some prior art tunable external-cavity diode lasers (such as Yenista's Tunics Reference and wide band versions of the Tunics Plus), the chromatic effects are mitigated by mounting the collimating lens on a piezo actuator. The actuator displaces the collimating lens longitudinally along the optical axis while the laser is being tuned, so as to counteract the chromatic effect. This may at least partly correct the chromatic effects of the collimating lens, keeping the beam collimated whatever the wavelength of operation. This chromatic compensation is nonetheless made at the expense of additional hardware, cost and complexity.

There therefore remains a need for an improved tunable external-cavity diode laser allowing to obtain a broad tuning range without significant optical power drop at extremities of the tuning range.

SUMMARY

In accordance with one aspect, there is provided a tunable external-cavity laser and a tunable laser source based on such a tunable external-cavity laser. The proposed solution uses a collimating lens system comprising at least two spaced-apart lenses: the first (imaging) lens comprises a converging lens having a short focal distance and inducing some chromatic aberrations. The second (collimating) lens comprises a collimating complex lens which also serves as a chromatic-aberration compensator. The second lens is designed to at least partially compensate for chromatic aberrations induced by the first lens.

There is provided a tunable external-cavity laser and a tunable laser source based on such tunable external-cavity laser. The tunable external-cavity laser comprises: two reflective surfaces to form a laser cavity therebetween; an active waveguide for amplifying laser light propagating in the laser cavity; a tunable wavelength-selective filter with in the laser cavity for selecting the emission wavelength of the tunable external-cavity laser within a tuning range; and a collimating lens system for collimating the optical beam out of the active waveguide for propagation in the laser cavity. The collimating lens system comprises a converging imaging lens and a collimating lens for collimating the optical beam. The imaging lens induces a positive chromatism within the tuning range and the collimating lens comprises a complex lens inducing a negative chromatism within the tuning range so as to at least partially compensate for the positive chromatism induced by the imaging lens.

In accordance with another aspect, there is provided a tunable laser source based on a tunable external-cavity laser, the tunable laser source comprising:

two reflective surfaces to form a laser cavity therebetween;

an active waveguide for amplifying laser light propagating in the laser cavity;

a tunable wavelength-selective filter within the laser cavity for selecting the emission wavelength of the tunable external-cavity laser within a tuning range;

a collimating lens system for collimating the optical beam out of the active waveguide for propagation in the laser cavity;

wherein said collimating lens system comprises:

a converging imaging lens defining an image plane, said at least one imaging lens inducing a positive chromatism within said tuning range; and a collimating lens for collimating the optical beam coming from the image plane, said collimating lens comprising a complex lens inducing a negative chromatism within said tuning range so as to at least partially compensate for the positive chromatism induced by the imaging lens.

In accordance with another aspect, there is provided tunable external-cavity laser comprising:

two reflective surfaces to form a laser cavity therebetween;

an active waveguide for amplifying laser light propagating in the laser cavity;

a tunable wavelength-selective filter within the laser cavity for selecting the emission wavelength of the tunable external-cavity laser within a tuning range; and a collimating lens system for collimating the optical beam out of the active waveguide for propagation in the laser cavity;

wherein said collimating lens system comprises:

a converging imaging lens defining an image plane, said imaging lens inducing a positive chromatism within said tuning range; and a collimating lens for collimating the optical beam coming from the image plane, said collimating lens comprising a complex lens inducting a negative chromatism within said tuning range so as to at least partially compensate for the positive chromatism induced by the imaging lens.

In some embodiments, the tunable external-cavity laser is based on a Littman-Metcalf type configuration but the above-described collimating system with chromatic aberration compensation may also be used in other types of tunable external-cavity laser configurations such as, e.g., a Littrow configuration or other configurations of tunable external-cavity lasers.

In the embodiments illustrated herein, the active waveguide is embodied as a laser diode chip but it will be understood that the proposed chromatic aberration compensation equally applies to a tunable external-cavity laser wherein the active waveguide is embodied as a doped planar waveguide or a doped optical fiber for example. Other active waveguides may also be envisaged.

In this specification, unless otherwise mentioned, the term "lens" is not meant to be limited to a single lens. A "lens", as in the expressions "an imaging lens" and "a collimating lens", may consist of a single lens, a complex lens (such as a lens doublet) or a group of two or more lenses. For example, an imaging lens may be embodied as a dual-lens system (see, e.g., FIGS. 15, 16, 19A and 20A).

In this specification, unless otherwise mentioned, word modifiers such as "substantially" and "about" which modify a value, condition, relationship or characteristic of a feature or features of an embodiment, should be understood to mean that the value, condition, relationship or characteristic is defined to within tolerances that are acceptable for proper operation of this embodiment in the context its intended application.

In the present description, and unless stated otherwise, the terms "connected", "coupled" and variants and derivatives thereof refer to any connection or coupling, either direct or indirect, between two or more elements. The connection or coupling between the elements may be mechanical, physical, operational, electrical or a combination thereof.

In the present description, the terms "light" and "optical" are used to refer to radiation in any appropriate region of the electromagnetic spectrum. More particularly, the terms "light" and "optical" are in no way to be herein limited to visible light, but includes, for example, the infrared wavelength range. For example, in some embodiments, the tunable laser can be tuned within a wavelength band lying somewhere in the range from about 1200 nm to about 1700 nm. Those skilled in the art will understand, however, that this wavelength span is provided for illustrative purposes only and that the tunable laser may operate over a different range, including smaller or larger ranges.

Further features and advantages of the present invention will become apparent to those of ordinary skill in the art upon reading of the following description, taken in conjunction with the appended drawings.

BRIEF DESCRIPTION OF THE DRAWINGS

FIG. 1 is a schematic showing a tunable external-cavity diode laser source based on diffraction grating technology, as known in the art.

FIG. 2 is a schematic illustrating the chromatic aberrations in an external-cavity diode laser source as shown in FIG. 1.

FIG. 7 comprises FIG. 7A and FIG. 7B, wherein FIG. 7A is a schematic illustrating a tunable external-cavity diode laser based on a Littrow configuration and FIG. 7B is a schematic illustrating a tunable external-cavity diode laser based on a Littman-Metcalf configuration.

FIG. 8 is a schematic illustrating the chromatic aberration compensation in an external-cavity diode laser source as shown in FIG. 3 as a function of lens design parameters.

Figure 3:
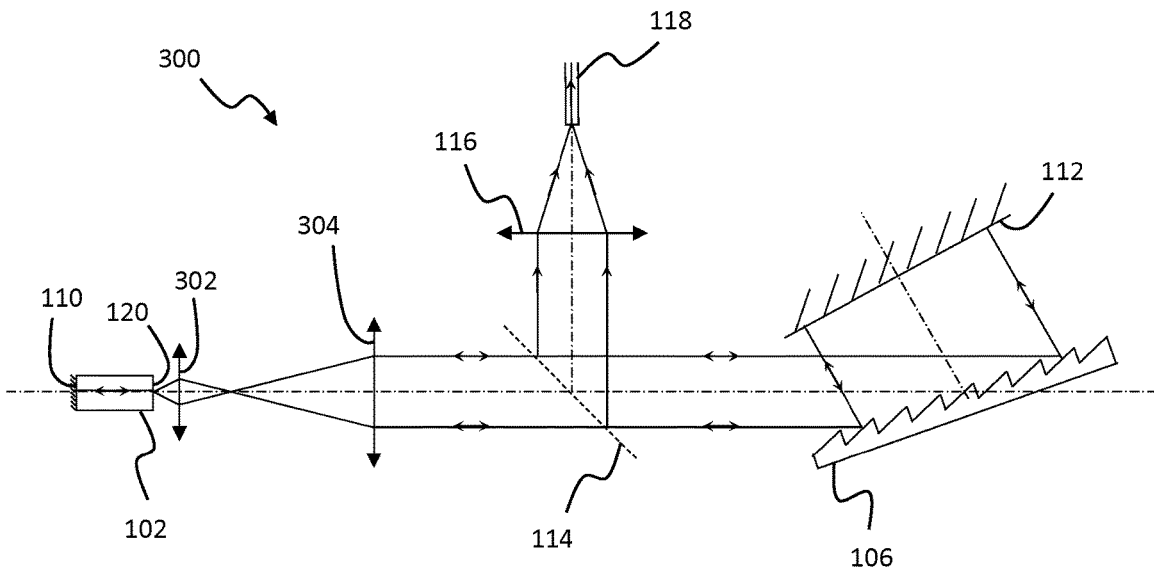
FIG. 3 is a schematic showing a tunable external-cavity diode laser source in accordance with one embodiment in which the collimating lens is replaced with a collimating lens system consisting of two lenses.

It will be noted that throughout the drawings, like features are identified by like reference numerals. In the following description, similar features in the drawings have been given similar reference numerals and, to not unduly encumber the figures, some elements may not be indicated on some figures if they were already identified in a preceding figure. It should be understood herein that elements of the drawings are not necessarily depicted to scale, since emphasis is placed upon clearly illustrating the elements and structures of the present embodiments. Some mechanical or other physical components may also be omitted in order to not encumber the figures.

The following description is provided to gain a comprehensive understanding of the methods, apparatus and/or systems described herein. Various changes, modifications, and equivalents of the methods, apparatuses and/or systems described herein will suggest themselves to those of ordinary skill in the art. Description of well-known functions and structures may be omitted to enhance clarity and conciseness.

Although some features may be described with respect to individual exemplary embodiments, aspects need not be limited thereto such that features from one or more exemplary embodiments may be combinable with other features from one or more exemplary embodiments.

DETAILED DESCRIPTION

FIG. 1 illustrates a tunable external-cavity diode laser source 100 based on diffraction grating technology, as known in the art. In general, the laser cavity of a tunable laser source 100 comprises a gain medium, here a laser diode chip 102, a wavelength-selective element, here a diffraction grating 106, collimating optics 104 and two reflective surfaces, herein the reflective end-face 110 of the laser diode chip 102 and an additional mirror 112, which constitute the ends of the laser cavity. The rotation of this mirror 112 in combination with the diffraction grating 106 produces a tunable wavelength-selective filter.

The laser source 100 further comprises power extraction optics, herein an optical beam-splitter 114 used to extract a portion of laser light out of the laser cavity and an optional coupling lens or lens system 116 to couple the extracted light into an optical fiber 118 at the output of the tunable laser source 100, if desirable for the intended application.

The laser diode chip 102 is used here as the gain medium to amplify of laser light propagating in the laser cavity. The guiding structure of the laser diode chip 102 typically guides the amplified light into a single transverse mode of emission. Typically, the laser diode chip 102 has one reflective end-face 110 which constitutes one end of the laser cavity, while the other end face 120 is coated with an anti-reflection coating to allow amplified light to escape the laser diode chip 102 toward the wavelength-selective element 106.

The collimating optics 104 comprises a collimating lens or lens system used to collimate the optical beam out of the laser diode chip 102 for it to propagate in the laser cavity toward the diffraction grating 106 and the end mirror 112. It may consist of a single lens or a complex lens (such as a lens doublet).

The illustrated tunable wavelength-selective filter (herein implemented as a reflector) is configured in a Littman-Metcalf configuration which uses the diffraction grating 106 and the mirror 112. The tunable wavelength-selective reflector is an afocal optical system with a diffractive element (diffraction grating 106) and a reflective element (mirror 112). It allows to select the emission wavelength of the laser by rotating the mirror 112 (see FIG. 7B). The tunable wavelength-selective reflector may use other types of configurations such as, e.g., the Littrow configuration (see FIG. 7A) or any other configurations suitable for tunable external-cavity diode lasers. For example, in either a Littrow or a Littman-Metcalf configuration, the emission wavelength of the tunable laser source 100 is tuned by rotating one of the optical elements, i.e., the diffraction grating 106 or the mirror 112. In a Littman-Metcalf configuration, the emission wavelength is tuned by rotating the mirror 112, whereas in a Littrow configuration the wavelength is tuned by rotating the diffraction grating 106 (used as both a diffractive and a reflective element in this case). In any case, power may be extracted from the cavity by various means, including (as in FIGS. 7A and 7B) from the zero-diffraction order of the diffraction grating 106 or from the back reflective end-face 110 of the laser diode chip 102 (by making it partially reflective), or (as in the embodiment of FIG. 1) using an optical beam-splitter 114 inserted inside the laser cavity.

In the embodiment of FIG. 1, the laser cavity is formed between back reflective end-face 110 of the laser diode chip 102 and the mirror 112. It is noted that the end-face 110 may also be made partially reflective, as well as all reflective surfaces that form the laser cavity, e.g., to extract laser power out of the laser or to monitor laser power. The other cavity mirror 112 can be either a simple plane mirror, a hollow roof mirror or a right-angled reflecting dihedron (as detailed, for example, in U.S. Pat. No. 5,886,785A to Lefevre et al.).

In the embodiments illustrated herein, the wavelength-selective element is embodied as a reflective diffraction grating 106 but it will be understood that other technologies may be used to embody the wavelength-selective element, either in reflection or in transmission. As examples for such element, one can consider a transmissive Fabry-Perot filter or a transmissive diffraction grating.

FIG. 2 illustrates the effect of the chromatic aberrations generated by the collimating lens 104 in the laser of FIG. 1. To simplify FIG. 2, the wavelength-selective reflector is replaced by an equivalent plane mirror 202 but is should be understood that the mirror 202 is meant to be replaced by any tunable wavelength-selective reflector such as a Littrow or a Littman-Metcalf configuration.

Referring to FIG. 2, for a given emission wavelength, there is an optimal longitudinal position of the collimating lens 104 to minimize optical loss on a round trip within the laser cavity and maximize laser efficiency. An optimal adjustment generally corresponds to obtaining a collimated beam. Due to the chromatic aberrations of the collimating lens 104, this optimal longitudinal position may vary with the emission wavelength of the laser. In other words, the focal length of the collimating lens 104 varies with wavelength. If its position is optimized for the center wavelength of the tuning range, it may result in a degradation of laser performance at both extremities of the tuning range. This effect leads to reduced laser power at extremities of the tuning range, which may further lead to a modification of the operating regime of the laser if the feedback becomes insufficient to maintain a continuous single-frequency emission of the laser cavity.

In classic configurations of such a tunable laser source 100, the collimating lens 104 typically comprises a single lens. Due to the high divergence of the light beam out of the laser diode chip, the collimating lens 104 is embodied by a converging lens having a very short focal length (typically 2 to 3 mm). Moreover, in order to limit geometric aberrations (in particular spherical aberration), the collimating lens 104 typically has aspherical surfaces.

Like any simple lens, because of the chromatic dispersion of the refractive index n of the material used to make the lens, the focal length f of the lens varies with wavelength λ. More precisely, in the approximation of a thin lens, the following relationship applies for the variation of focal length δf (also called focal shift) as a function of the variation of refractive index δn:

$$\frac{\delta f}{f} = -\frac{\delta n}{n-1} = \frac{1}{V} \tag{1}$$

For a given spectral band, the parameter V, called Abbe number or constringence, characterizes the chromatism of the material used. This parameter is always strictly positive. The focal length of a convergent simple lens always increases with the wavelength. An achromatic system is not possible in this case. If we optimize the collimation of the beam in the laser cavity for a given wavelength $\lambda_0$, for any greater wavelengths (respectively lower), the light beam out of the collimating lens 104 will be slightly divergent (respectively convergent).

In any case, after a round trip in the laser cavity, the chromatic aberration of the lens induces a defocusing δz of the beam with respect to the output end face 120 of the laser diode chip 102, which introduces additional coupling loss in recoupling laser light to the laser diode waveguide. This coupling loss may be important if the focal shift becomes significant compared with the Rayleigh length $Z_R$ of the light beam corresponding to the guided mode in the laser diode chip 102.

Because the collimating lens 104 has a short focal length, it is not possible to use classic achromatic complex lenses such as an achromatic doublet. Such achromatic complex lenses are not technically feasible for such short focal lengths, especially for an operation range in the infrared spectrum.

FIG. 3 illustrates a tunable external-cavity diode laser source 300 in which the collimating lens 104 is replaced with a collimating lens system consisting of at least two lenses, i.e., an imaging lens 302 and a collimating lens 304.

As in the laser source 100 of FIG. 1, the laser source 300 also comprises a gain medium, here a laser diode chip 102, a tunable wavelength-selective element, here a diffraction grating 106, and two reflective surfaces, herein the reflective end-face 110 of the laser diode chip 102 and an additional mirror 112, which constitute the ends of the laser cavity. These components are like those of the laser source of 100 of FIG. 1 and will therefore not be repeatedly described.

The first lens 302 (also referred to herein as the "imaging lens 302") is a converging lens having a short focal length which is used to magnify the optical beam out of the laser diode chip 102. For example, in one embodiment, the magnification (in absolute value) may be by a factor of 2.5 to 5. In other words, the imaging lens 302 captures the optical beam out of the laser diode chip 102 and converges it to define an image plane, to facilitate collimation by the second lens 304 (also referred to herein as the "collimating lens 304"). Here, the image plane lies between lens 302 and lens 304 but in other embodiments (see, e.g., FIGS. 14, 16, 18A and 20A) the image may be virtual (i.e., the image plane located upstream from the exit face of lens 302). The second lens 304 is used to collimate the magnified optical beam for it to propagate in the laser cavity toward the wavelength-selective element 106 and the end mirror 112. The first and the second lenses 302, 304 may each consist of a single lens or a complex lens (such as a lens doublet).

As in the embodiment of FIG. 1, both the first lens 302 and the second lens 304 may include aspheric surfaces in order to limit geometric aberrations (in particular spherical aberration).

For a same diameter of the collimated beam, the magnification provided by the imaging lens 302 increases the focal length of the collimating lens 304 when compared with the collimating lens 104 of the laser of FIG. 1. For example, in one embodiment, the focal length of the collimating lens 304 may be between 6 and 10 mm.

As in the laser source 100 of FIG. 1, the imaging lens 302 induces a longitudinal chromatic aberration. For example, in the embodiment of FIG. 3, the focal length of lens 302 increase with wavelength and the position of the focusing point after the lens 302 thereby moves away from lens 302 for greater wavelengths. In such case, the chromatism is said to be positive chromatism, i.e., δf>0 for δλ>0.

More specifically, a lens or a lens system is said to induce positive chromatism if its focal length increases with wavelength. Conversely, a lens or a lens system is said to induce negative chromatism if its focal length decreases with wavelength.

If the second lens 304 is designed as a single converging lens, its longitudinal chromatic aberration will add to that of the first lens 302 to increase the total chromatism in the cavity.

However, it was found that a longer focal length of the second lens 304 provides more freedom with its design and allows for implementation as a complex lens (such as a doublet or triplet lens for example). Such a complex lens advantageously allows to choose the level of longitudinal chromatic aberration of the second lens 304 by design in order to compensate for all or at least part of the longitudinal chromatic aberration induced by the first lens 302.

Figure 4:
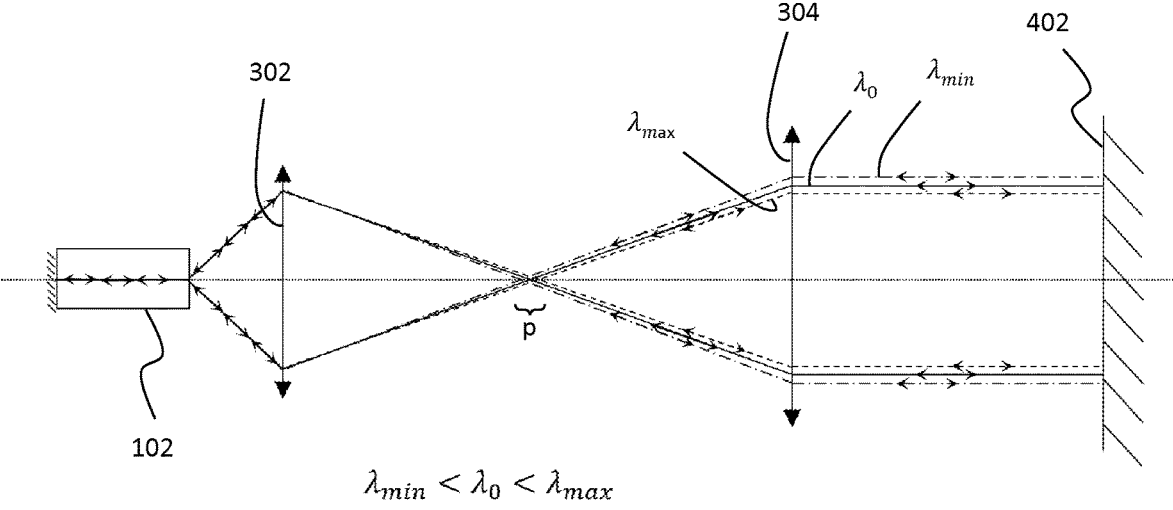
FIG. 4 is a schematic illustrating the chromatic aberration compensation in an external cavity diode laser as shown in FIG. 3.

FIG. 4 illustrates the chromatic effects of an example design of the collimating lens system in the laser of FIG. 3. Again, to simplify FIG. 4, the wavelength-selective reflector is replaced by an equivalent plane mirror 402 but is should be understood that the mirror 402 is meant to be replaced by any tunable wavelength-selective reflector such as a Littrow or a Littman-Metcalf configuration.

Referring to FIG. 4, in an ideal design, the back focal length $f_b$ of the second lens 304 would vary in wavelength so to match the shift of the image position p given by the first lens 302, so that the longitudinal chromatic aberrations in the cavity are compensated and the collimation is preserved whatever the wavelength. To achieve such compensation, the back focal length $f_b$ of the second lens 304 should decrease with wavelength. The second lens 304 should therefore be designed to obtain a negative chromatism (δf<0 for δλ>0).

In order to achieve such negative chromatism, the second lens 304 may be embodied as a cemented lens doublet for example. Compared to a conventional doublet, the goal here is not to obtain an achromatic doublet but rather to obtain an adequate value of longitudinal chromatism to minimize the chromatism in the cavity.

Design parameters for such a cemented doublet are as follows:

- The choice of material for each of the two elements of the doublet
- The external radius of curvature $R_1$ of the first element
- The external radius of curvature $R_2$ of the second element
- The radius of curvature $R_c$ of the common inner bonding surface of the two elements
- The thicknesses $e_1$ and $e_2$ at the center of each of the two elements of the doublet The values of these parameters are limited by practical feasibility criteria of the optical elements of the doublet (existing materials, minimum manufacturable radius of curvature, minimum thickness at the edge, etc.).

An optimization of these design parameters may then be performed in order to satisfy the following conditions:

Obtaining the desired focal length $f_0=f(\lambda_0)$ at the central wavelength $\lambda_0$ Obtaining the desired variation $\delta f_b$ of the back focal length $f_b$ in the relevant spectral band $[\lambda_{min}$ to $\lambda_{max}]$.

Minimizing the effects of lens-induced geometrical aberrations on the laser beam propagation, which may generally correspond to cancelling spherical aberration at the central wavelength $\lambda_0$ for an object at infinity In order to obtain a doublet design with a negative $\delta f_b$ value, materials used for each element of the doublet should be carefully selected.

This requirement can be illustrated by the following formulas which give, in the thin lens approximation, the expression of the focal length $f_i$ (i=1, 2) of each of the two elements of the doublet:

$$\begin{cases} f_1 = \dfrac{(V_1 - V_2)\, f_0^2}{V_1\, (f_0 - V_2\, \delta f)} \\ f_2 = \dfrac{(V_2 - V_1)\, f_0^2}{V_2\, (f_0 - V_1\, \delta f)} \end{cases} \qquad (2)$$

wherein the constringence $V_i$ of each material is defined here on the relevant spectral band:

$$V_i = \frac{n_i(\lambda_0) - 1}{n_i(\lambda_{min}) - n_i(\lambda_{max})} \quad i = 1, 2 \qquad (3)$$

Assuming $V_1 > V_2$, then the first element of the doublet will be a convergent lens while the second element is a divergent lens. It emerges from the above equations that the greater the value of $V_1$ and the smaller that of $V_2$, the greater will be the focal lengths of the first and the second elements (in absolute value) and thus the more practically achievable will be the doublet. This condition is further reinforced in the case of a negative value of $\delta f$ because it contributes to increase the value of the denominator in Equation (2).

It should be noted that the choice of materials for the first and the second element is particularly delicate when the spectral range of interest is located in the infrared spectrum (e.g., between 1200 and 1700 nm). Indeed, while it is easy to find commercially available glasses with very different constringence values for a spectral range located in the visible spectrum, this is not the case in the infrared spectrum where these same glasses generally have fairly close constringence values. This means that the choice is much more limited, especially for materials with high constringence. Nevertheless, there are some practical solutions among the materials available today. The following materials in particular have been identified: Fluor-Crown glasses (e.g., Schott N-FK5, N-FK51A and N-FK58) as well as calcium fluoride ($CaF_2$) and barium fluoride ($BaF_2$) crystals.

One embodiment of a tunable laser is now described in more details. In accordance with this embodiment, the laser is designed for tunability over the E and S telecom bands and the tuning range covers for $\lambda_{min}$=1350 nm to $\lambda_{max}$=1510 nm. This embodiment uses a lens system comprising a first lens 302 and a second lens 304.

The second lens 304 (collimating lens) has a focal length $f_0$=8 mm and is embodied as a doublet lens having a negative chromatism in the ES band ($\delta f_b \approx -16$ µm) to compensate (here partially) that of the first lens 302. Both lenses also have anti-reflective coatings adapted for the relevant tuning range.

Figure 5:
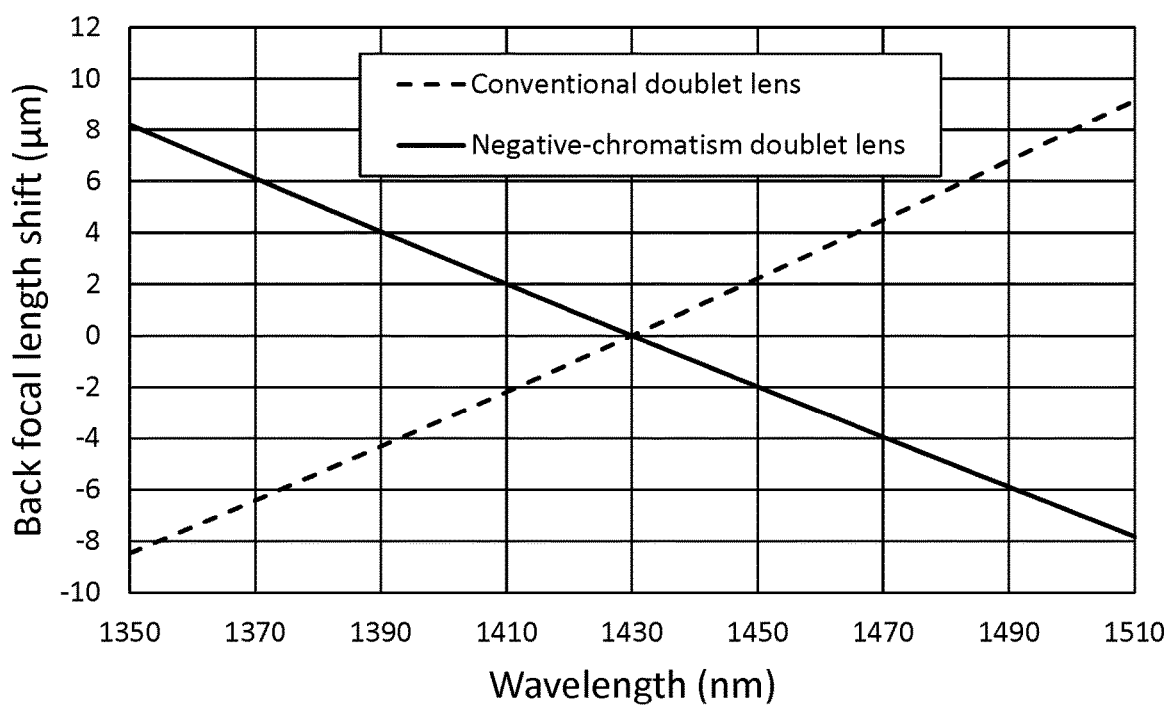
FIG. 5 is a graph showing the longitudinal chromatic aberration of the back focal length of a chromatic-compensation doublet when compared with a conventional and commercially available achromatic doublet (at $\lambda=780$ nm).

FIG. 5 shows the chromatic variation of the back focal length of this doublet (over the relevant spectral range) when compared with a conventional and commercially available doublet designed to be achromatic at $\lambda$=780 nm and which thus present a significant positive chromatism in the ES band ($\delta f_b \approx 18$ µm).

The combined chromatic aberrations of the first and the second lenses of the laser cavity result in a variation of the focusing point of the light beam after a round trip to and from the tunable wavelength-selective filter 402. This variation of the focusing point then results in a variation of the coupling efficiency of the light beam back to the laser diode chip 102.

Figure 6:
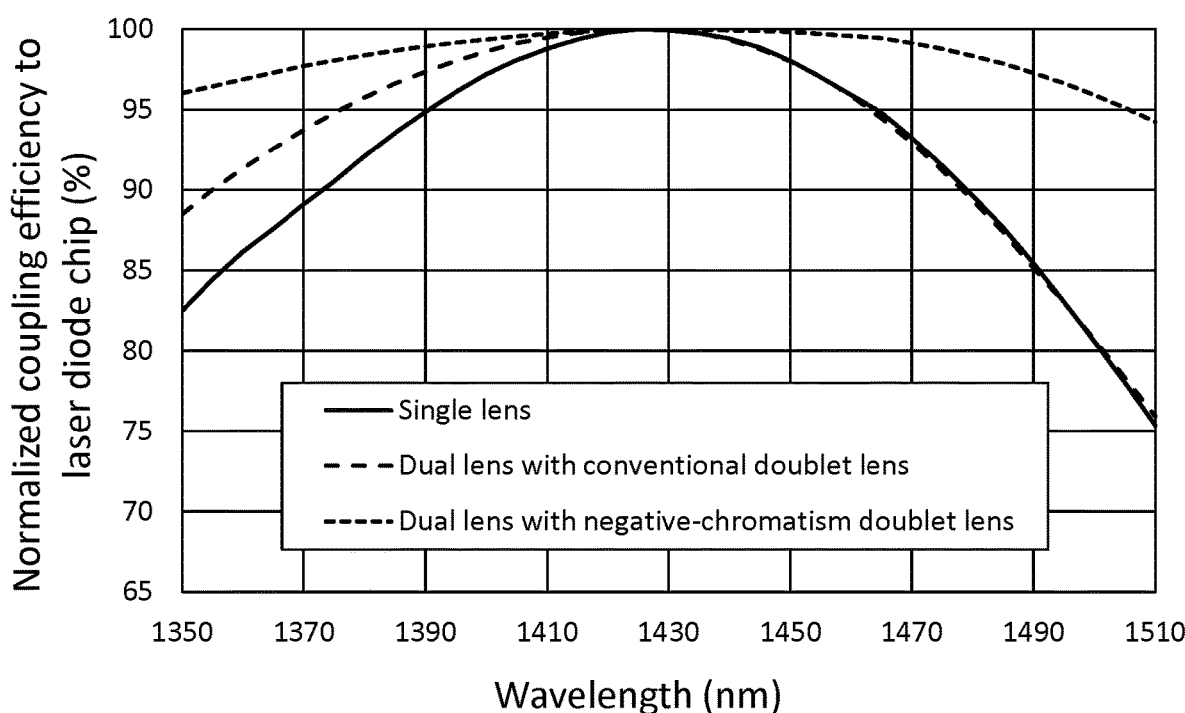
FIG. 6 is a graph showing the spectral variation of the coupling efficient of the light beam to the laser diode chip for three (3) different lens system configurations.

FIG. 6 shows the result of a calculation using an optical simulation software used to model the propagation of the light beam in the laser cavity. This model looks specifically at the spectral variation of the coupling efficiency of the light beam back to the laser diode chip 102, which value directly influences the efficiency of the laser cavity. FIG. 6 compares the coupling efficiency of a tunable laser which uses a single lens or dual lens using a conventional doublet to the improved tunable laser which uses a negative-chromatism doublet.

This result highlights the significant advantage of the proposed solution to minimize coupling losses over entire tuning range and especially at both extremities of the tuning range. Although only partial compensation of the chromatism is achieved in this embodiment, it still significantly improves the performance of the laser at both extremities of the tuning range.

It is noted that in embodiments for which light is coupled to an optical fiber 118 at the output of the laser source 300, the chromatism of optional coupling lens or lens system 116 may also be optimized in order to optimize the coupling efficiency to the optical fiber 118 over the entire spectral range and thereby minimize the wavelength dependence of the coupling coefficient to the output fiber. If the laser cavity is substantially achromatic (chromatic effects are compensated), then the coupling lens or lens system 116 may be made achromatic for optimal coupling. On the other hand, if the chromatic compensation by the second lens 304 is only partial, the coupling lens or lens system 116 may be designed to compensate (at least partially) any residual chromatic aberrations of the laser cavity and optimize the coupling efficiency. In this respect, in some embodiments, the coupling lens or lens system 116 may therefore be designed with a negative chromatism.

Axial Chromatism:

Referring to FIG. 8, some concepts are now defined in order to better support the following description.

For a one-way propagation of a collimated light beam from the wavelength-selective reflector 402 to the laser diode chip 102, let's define the axial chromatism (noted AXCL for AXial CoLor) as the deviation of the longitudinal position of the image plane at the maximum wavelength compared to that of the minimum wavelength over the relevant tuning range. In an ideal world, the position of the image plane would be fixed at chip end face 120 for optimal coupling of the light beam back into the laser diode chip 102 over the whole tuning range and so, the objective is to minimize this deviation.

Let's define:

g: magnification of the imaging lens $L_i$ (<0 or >0) from object $A_i$ (located at chip end face 120) to image $A'_i$ d': image distance produced by lens $L_i$ (from lens output surface)

$AXCL_i = \delta d'$: axial chromatism of this image distance (supposed to be >0)

$f_c$: focal length of the collimating lens $L_c$ $f_b$: back focal length of the collimating lens $L_c$ $AXCL_c = \delta f_b$: axial chromatism of the collimating lens $L_c$ (> or ≤0)

$$f = \frac{f_c}{|g|}:$$

focal length of the system

AXCL: one-way trip axial chromatism of the whole system

Then:

$$AXCL = \frac{AXCL_c + AXCL_i}{g^2} = f^2 \frac{AXCL_c}{f_c^2} + \frac{AXCL_i}{g^2}$$

The single lens case (as in FIG. 1) is included and corresponds to g=1 and $AXCL_i$=0.

In the case of a system with an imaging lens and a collimating lens (as in FIG. 3), the collimating lens can be used to compensate the axial chromatism of the imaging lens (if $AXCL_c$<0), which can reduce or even cancel the axial chromatism of the system. This compensation will be facilitated if the contribution $AXCL_i$ of the imaging lens is reduced by optimizing its design.

On a roundtrip from the diode chip end face 120 to the wavelength-selective reflector and back to the diode chip end face 120, the axial chromatism is doubled compared to the one-way trip:

$\delta z$: round-trip axial chromatism of the system

Then:

$$\delta z = 2 \; AXCL = \frac{2(AXCL_c + AXCL_i)}{g^2}$$

Coupling Efficiency:

The coupling efficiency back to the laser diode chip 102 is affected by the round-trip axial chromatism of the system.

Let's define:

$\delta z_x$: axial chromatism along the x axis $\delta z_y$: axial chromatism along the y axis $w_{0x}$: beam radius of the guided mode along the x axis (assumed Gaussian)

$w_{0y}$: beam radius of the guided mode along the y axis (assumed Gaussian)

$T_{min}$: minimum relative coupling efficiency of the system over the tuning range (achieved at extremities of this range)

Then, for an optimal coupling at the central wavelength $\lambda_0$ and assuming a linear variation of image position with wavelength:

$$T_{min} \approx \frac{1}{\sqrt{1 + \left(\frac{\delta z_x/2}{2\,Z_{Rx}}\right)^2}} \cdot \frac{1}{\sqrt{1 + \left(\frac{\delta z_y/2}{2\,Z_{Ry}}\right)^2}}$$

wherein $Z_{Rx}$ (respectively $Z_{Ry}$) is the Rayleigh length along x (respectively along y):

$$Z_{R\,x,y} = \frac{\pi\,w_{0\,x,y}^2}{\lambda} \quad \text{(evaluated at central wavelength)}$$

Assuming no astigmatism we have $\delta z_x = \delta z_y = \delta z$. For a hypothetically symmetrical waveguide we then have:

$$T_{min} \approx \frac{1}{1 + \left(\frac{\delta z}{4\,Z_R}\right)^2}$$

Example 1

In one embodiment, the focal length f of the complete system is ≈2.13 mm. The magnification g of the imaging optical system is a parameter that is determined by the choice of the focal length of the collimating lens. This focal length should be large enough to correspond to a feasible doublet but not too large to limit the overall length of the cavity. For example, we can choose $f_c$=8 mm, which corresponds to |g|≈3.75.

In this embodiment, the waveguide is an asymmetrical waveguide, and we typically have at $\lambda$=1.43 μm, $w_{0x}$=1.85 μm and $w_{0y}$=1.23 μm.

Hence the corresponding Rayleigh lengths $Z_{Rx}$=7.52 μm and $Z_{Ry}$=3.32 μm.

Figure 9:
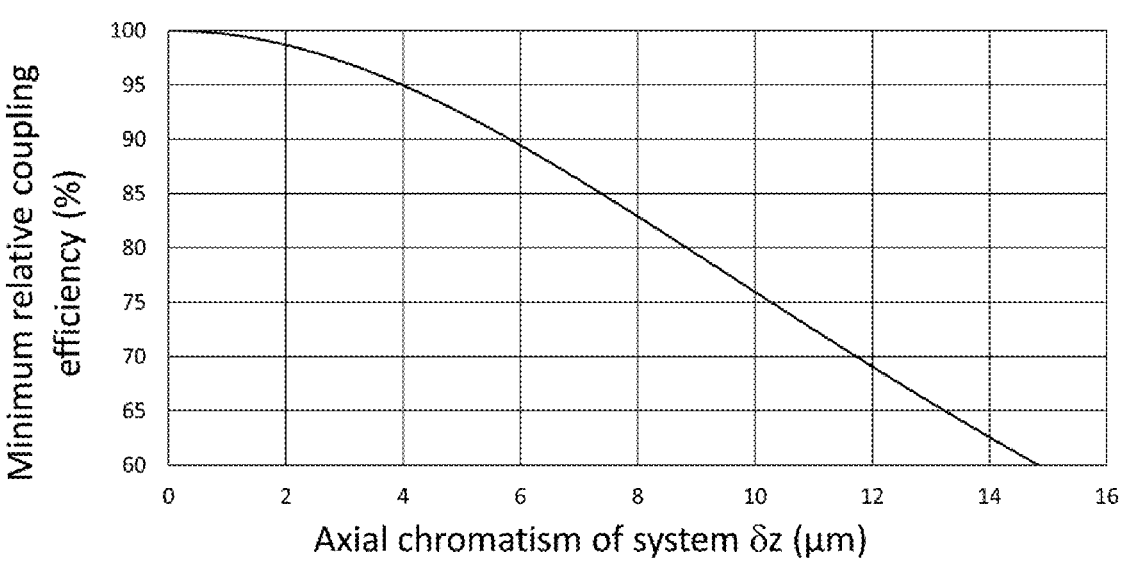
FIG. 9 is a graph showing the evolution of the minimum relative coupling efficiency over the whole tuning range as a function of the total axial chromatism, in accordance with one embodiment.

FIG. 9 shows the evolution of the minimum relative coupling efficiency over the whole tuning range (defined as the ratio of the minimal to maximal coupling efficiency over the tuning range) as a function of the total axial chromatism as calculated for this specific embodiment. Of course, the greater the minimum relative coupling efficiency, the less the optical power drop at extremities of the tuning range.

Figure 10:
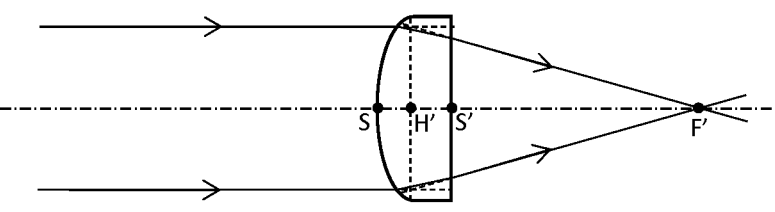
FIG. 10 is a schematic illustrating a simple collimating lens design.

Axial Chromatism Calculation vs Material Selection—Simple Lens:

Referring to FIG. 10, the axial chromatism is calculated for a simple collimating lens as a function of the selected material. For example, such simple lens may be employed as the collimating lens 104 in the system of FIG. 1. For simple converging lenses, axial chromatism is always strictly positive but the axial chromatism may be varied with the choice of material used and the lens shape.

In the general case, at least one surface of the lens is convex and both faces can be made aspherical. For example, we consider the case of a piano-convex lens (e.g., with an aspheric profile for the convex side) which allows a simple analytical calculation. The following formulas apply for such piano-convex lenses:

Glass refractive index: $n$ (at central wavelength)

constringence: $V = \dfrac{n-1}{\delta n}$

Thickness at center: $(S, S'$: front and rear surface vertices$)$

Radius of curvature of the convex face: $R$

Focal length: $f = H'F' = \dfrac{R}{n-1}$ $(H'$: rear principal point, $F'$: image focal point$)$ Back focal length: $f_b = S'F' = f - \dfrac{e}{n}$ Axial chromatism (back focal length shift): $AXCL = \delta f_b = \dfrac{f - \dfrac{e \cdot (n-1)}{n^2}}{V}$ For a given focal length, the main way to reduce chromatism is to use a high constringence material.

For example, over the ES band, when using S-LAH60M material (n=1.802) in the example case of a lens of focal length f=2.1 mm with thickness e=1.85 mm, we find:

V=271

$\Rightarrow$AXCL$\approx$6 μm

δz$\approx$12 μm $\Rightarrow$T$_{min}$$\approx$69%

Figure 11:
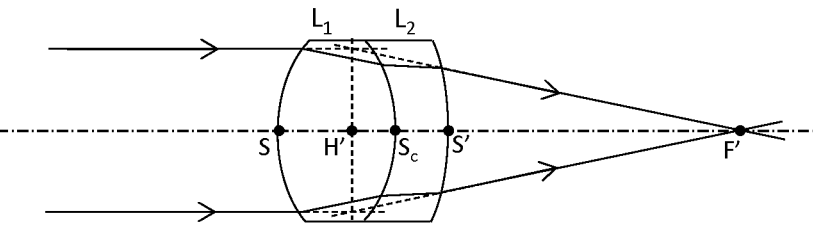
FIG. 11 is a schematic illustrating a doublet collimating lens design.

Axial Chromatism Calculation vs Material Selection—Doublet Lens:

Referring to FIG. 11, the axial chromatism is calculated for a converging doublet lens as a function of the selected material. Such doublet lens may be employed as the second lens 304. For doublet lenses, axial chromatism is may be made negative depending on the design and materials being used.

We consider here the case of a cemented doublet because this complex lens is the simplest that may be used to achieve the desired chromatism compensation. Advantageously, such cemented doublet does not require alignment between the elements. It will be understood that more complex lens system may also be used if desired (e.g., uncemented doublet, triplet, etc.).

Glass refractive index: $n_1, n_2$ constringence: $V_1 = \dfrac{n_1 - 1}{\delta n_1}$; $V_2 = \dfrac{n_2 - 1}{\delta n_2}$ Thickness at center: $e_1 = SS_c$; $e_2 = S_cS'$ Radius of curvature of the surfaces: $R_1$ (external surface of $L_1$)

$R_C$ (common interior surface)

$R_2$ (external surface of $L_2$)

Focal length: $f = H'F'$

Back focal length: $f_b = S'F'$

Axial chromatism (back focal length shift): $AXCL_c = \delta f_b$

In order to reduce the axial chromatism, to cancel it or even to obtain a negative chromatism, the glass of the first lens element $L_1$ may be selected to be slightly dispersive (strong constringence $V_1$ within the tuning range) while the glass of the second lens element $L_2$ may be selected to be strongly dispersive (weak constringence $V_2$). The greater the constringence contrast between the two lenses elements, the greater will be the chromatic compensation effect.

For example, for the strong constringence lens element, the following glasses may be considered:

BaF$_2$ and CaF$_2$ crystals

Ohara glasses of the Fluorophosphate type (e.g., S-FPL53 and S-FPL55)

Schott lenses of the Fluor Crown type (e.g., N-FK58 and N-FK51A) or of Phosphate Crown type (e.g., N-PK52A)

For low constringency glasses, the following glasses may be considered:

Ohara glasses of the Niobophosphate type (e.g., S-NPH1, S-NPH2 and S-NPH3)

Schott Dense Flint lenses (e.g., N-SF66, N-SF57, N-SF11 and N-SF6)

After having chosen the two glasses used as well as the thicknesses of the lenses (e$_1$, e$_2$), the design of the cemented doublet consists in determining the three radii of curvature (R$_1$, R$_c$ and R$_2$) so as to reach the following conditions:

Focal length of the doublet f=target value, e.g., 8 mm in the above example case A criterion to minimize the effects of geometrical aberrations on laser beam propagation. A good but not necessarily perfect condition is: coefficient of spherical aberration of the doublet=0

Axial chromatism of the doublet=target value

For a given pair of glass elements, the dispersion properties of these glasses and the feasibility constraints of the doublet (minimum value of the radius of curvature, minimum thickness at the edge of each lens) may limit the range of accessible values for axial chromatism.

The following table lists some examples of cemented doublet lens glasses which may be considered for the second lens 304.

| Design | Glass 1 | Glass 2 | δf$_b$ (μm) |
|---|---|---|---|
| 0 | N-LAK22 | N-SF6 | 17.6 |
| 1 | BaF$_2$ | S-NPH2 | −16.0 |
| 2a | BaF$_2$ | N-SF11 | −8.23 |
| 2b | BaF$_2$ | N-SF11 | −7.35 |
| 3 | N-PK52A | S-NPH2 | 0.43 |

Figure 12:
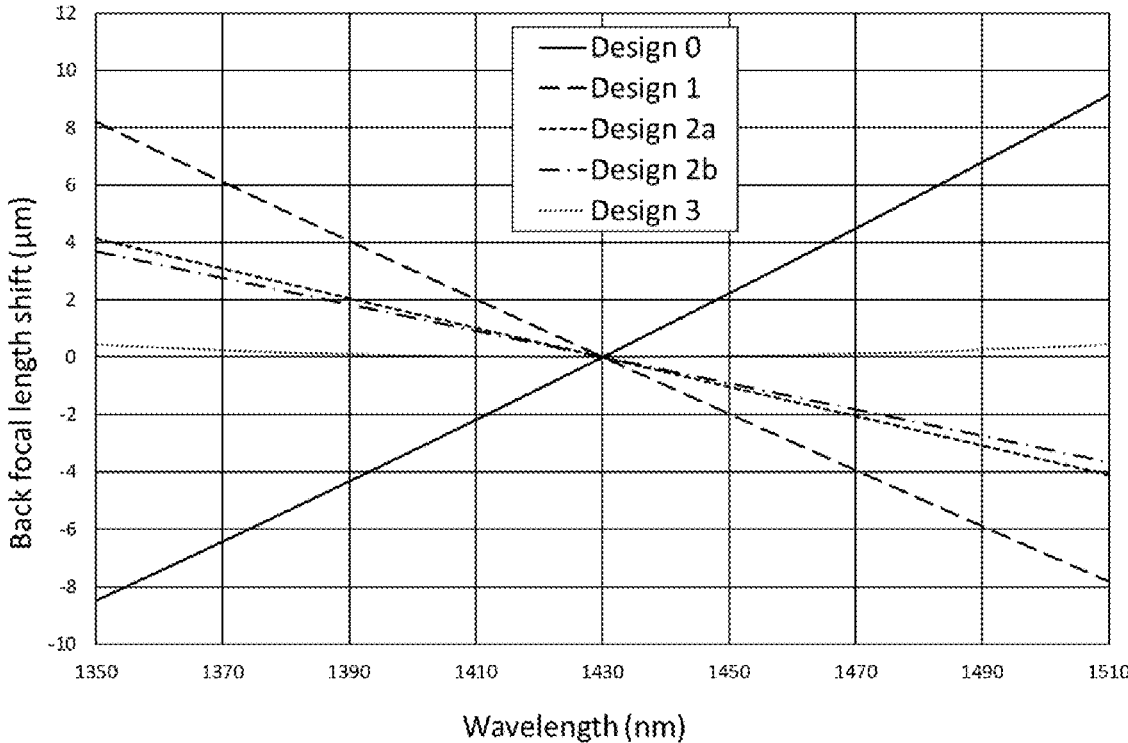
FIG. 12 is a graph showing the back focal length shift as a function of wavelength for various examples of doublet lens designs.

FIG. 12 shows the back focal length shift as calculated over the relevant tuning range for example designs employing the above glass combinations.

Figure 13:
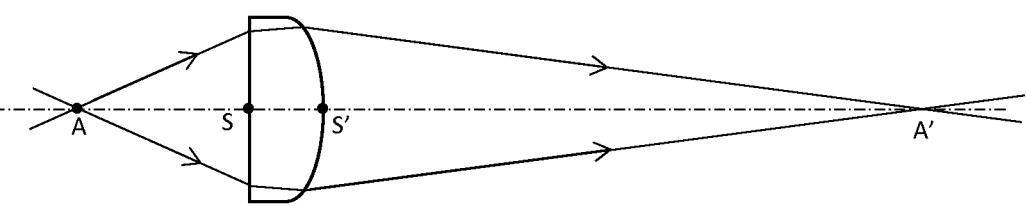
FIG. 13 is a schematic illustrating a simple imaging lens design which produces a real image.
Figure 14:
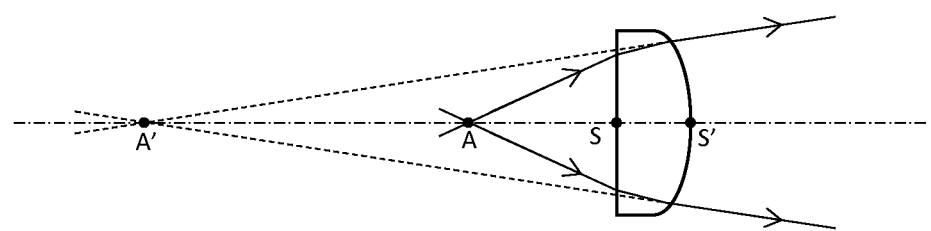
FIG. 14 is a schematic illustrating a simple imaging lens design which produces a virtual image.

Axial Chromatism Optimization of the Imaging Lens—Simple Lens Case:

Referring to FIGS. 13 and 14, the axial chromatism is calculated for a simple imaging lens as a function of the selected material. FIG. 13 represents the real image case (i.e., magnification g<0), whereas FIG. 14 represents the virtual image case (i.e., magnification g>0). In both figures, A stands for the object point and A' for the image point. For example, such converging lens may be employed as the imaging lens 302 in the system of FIG. 3. For simple lenses, axial chromatism is always strictly positive but the axial chromatism may be varied with the choice of material used and the conjugation configuration used.

As above, we consider as a representative example the case of a piano-convex lens (e.g., with an aspheric profile for the convex side). The following formulas apply for such piano-convex lenses:

Glass refractive index: $n$ constringence: $V = \dfrac{n-1}{\delta n}$

Thickness at center: $e = SS'$

Object distance: $d = AS$

Magnification: $g = \dfrac{f}{f - \dfrac{e}{n} - d}$ $(g < 0$ if $d > f_b)$

Image distance: $d' = SS'A' = -\left(d + \dfrac{e}{n}\right) \cdot g$

Axial chromatism (image shift): $AXCL_i = \delta d' = \dfrac{f \cdot (g-1)^2}{V} + \dfrac{e \cdot g^2}{n^2} \delta n$ The first term of the axial chromatism is always positive. The second term is negative ($\delta n < 0$) and partially compensates for the first.

Chromatism can be reduced by using a shorter focal length. This also has the advantage of reducing the footprint of the imaging lens. In practice, however, this approach is limited by the minimum focal length of commercially available lenses (i.e., in the range of 0.4 to 0.5 mm).

Another way to reduce chromatism is to use the virtual image case. Indeed, because the magnification g is then positive, the first term is significantly reduced. For example, $(g-1)^2 \approx 7.56$ for $g = 3.75$ wherein $(g-1)^2 \approx 22.56$ for $g = -3.75$. By combining this configuration and the use of a lens having a short focal length, the axial chromatism may be significantly reduced. Such configuration also allows to further reduce the length of the imaging lens (in this case distance AS' instead of AA'). It should be noted that the aspherization profile of the lens may be optimized according to the conjugation configuration (real or virtual image) to minimize geometrical aberrations.

For example, for an aspheric piano-convex lens made of using D-ZLAF52LAM ($V \approx 350$, $n \approx 1.78$, $\delta n \approx -0.0023$), having a focal length $f = 0.7$ mm and a thickness $e = 0.66$ mm, we obtain in a configuration with a real image an axial chromatism $AXCL_i$ of $\approx 38.4$ µm over the ES band while it is reduced to $\approx 8.4$ µm in the virtual image configuration.

However, it should be noted that such an aspheric lens optimized for a virtual image is not commercially available as a standard product at the time of filing this patent application. Other embodiments are therefore also considered.

Figure 15:
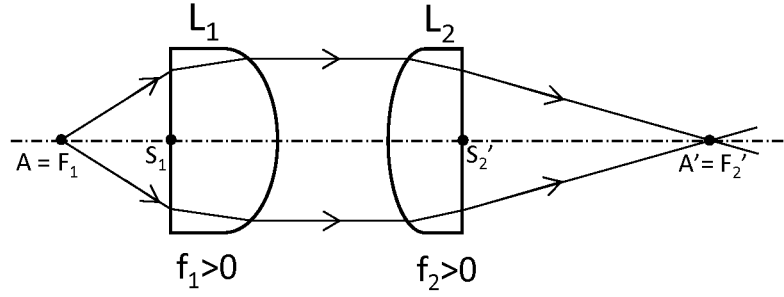
FIG. 15 is a schematic illustrating a dual-lens imaging lens design which produces a real image.
Figure 16:
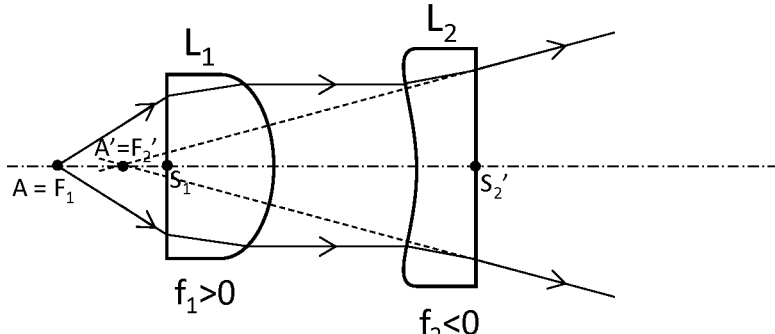
FIG. 16 is a schematic illustrating a dual-lens imaging lens design which produces a virtual image.

Axial Chromatism Optimization—Dual-Lens Imaging:

Referring to FIGS. 15 and 16, in other embodiments, the simple imaging lens may be replaced by a combination of two lenses $L_1$, $L_2$ working, for example, respectively in a focus-infinity and an infinity-focus conjugation. FIG. 15 represents a case where the two lenses are embodied as converging lenses. This configuration produces a real image (i.e., magnification $g < 0$). FIG. 16 represents a case where one lens $L_1$ is convergent and the other lens $L_2$ is divergent. This configuration produces a virtual image (i.e., magnification $g < 0$). For example, such lens combination may be employed as the imaging lens 302 in the system of FIG. 3.

The following formulas apply for piano-convex and piano-concave lenses:

Object distance: $d = AS_1 = f_{b1} = f_1 - \dfrac{e_1}{n_1}$

Magnification: $g = -\dfrac{f_2}{f_1}$

Image distance: $d' = S_2'A' = f_{b2} = f_2 - \dfrac{e_2}{n_2}$

Axial chromatism (image shift): $AXCL_i =$ $$\delta d' = \delta f_{b1} \cdot g^2 + \delta f_{b2} = \dfrac{\left(f_1 - \dfrac{e_1 \cdot (n_1 - 1)}{n_1^2}\right)}{V_1} \cdot g^2 + \dfrac{\left(f_2 - \dfrac{e_2 \cdot (n_2 - 1)}{n_2^2}\right)}{V_2}$$

For $f_1 > 0$, the first term of chromatism (induced by the first lens) is always positive but it can be reduced by using a short focal length. As for the second term (chromatism induced by the second lens), it is positive or negative depending on whether this lens is convergent or divergent. The latter allows to partially compensate the chromatism induced by the first lens.

The following table lists some examples of lens combination designs which may be considered for the imaging lens 302. The indicated value of axial chromatism is calculated over the ES band, for lenses made of D-ZLAF52LAM ($n_1 = n_2 \approx 1.78$; $V_1 = V_2 \approx 350$):

| | Lens $L_1$ | | Lens $L_2$ | | Axial chromatism (µm) | | |
|---|---|---|---|---|---|---|---|
| | $f_1$ | $e_1$ | $f_2$ | $e_2$ | $\delta f_{b1} \cdot g^2$ | $\delta f_{b2}$ | $AXCL_i$ |
| | (mm) | (mm) | (mm) | (mm) | | | |
| Real image | 0.6 | 0.87 | 2.25 | 2 | 15.5 | 5 | 20.5 |
| Virtual image | 0.6 | 0.87 | −2.25 | 2 | 15.5 | −7.8 | 7.7 |

By optimizing the design of this dual-lens imaging system, it is possible to significantly reduce its contribution to the chromatism of the whole lens system.

Again, the non-planar faces of these lenses may have an aspheric profile to reduce the geometric aberrations induced by each lens.

As in the case of single lens imaging, the footprint of the dual-lens system is reduced by using short focal length lenses. The virtual image case may also further contribute to reducing this footprint.

EXAMPLE EMBODIMENTS

Various example embodiments of the proposed solution are now described with reference to FIGS. 17A to 20B.

Figure 17A:
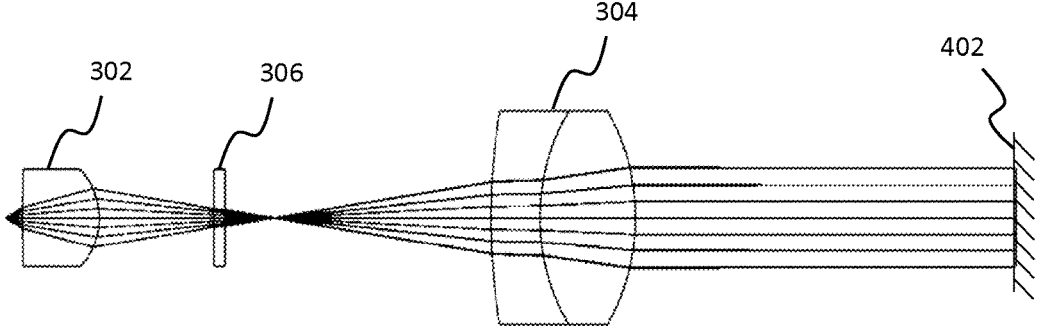
FIG. 17A is a schematic illustrating a chromatic aberration compensation in an external cavity diode laser as shown in FIG. 3, in accordance with one embodiment wherein the imaging lens is embodied as a simple lens producing a real image and the collimating lens is embodied as a doublet lens.

FIG. 17A shows an example embodiment wherein the first lens 302 is embodied as a simple converging lens (in the real image case) and the second lens 304 is embodied as a doublet lens (here design 1 described above). It should be noted that in some embodiments, the laser diode chip 102 and the first lens 302 may both be together encapsulated in within a chip package such as a butterfly package for example. Element 306 therefore represents a window of the package from which laser light may exit the package.

In one embodiment, we have:

Imaging lens:

$f_1$=1.167 mm g=-3.728

$AXCL_i$=53.71 μm

Collimating lens:

f=8 mm $AXCL_c$=-16.02 μm

Figure 17B:
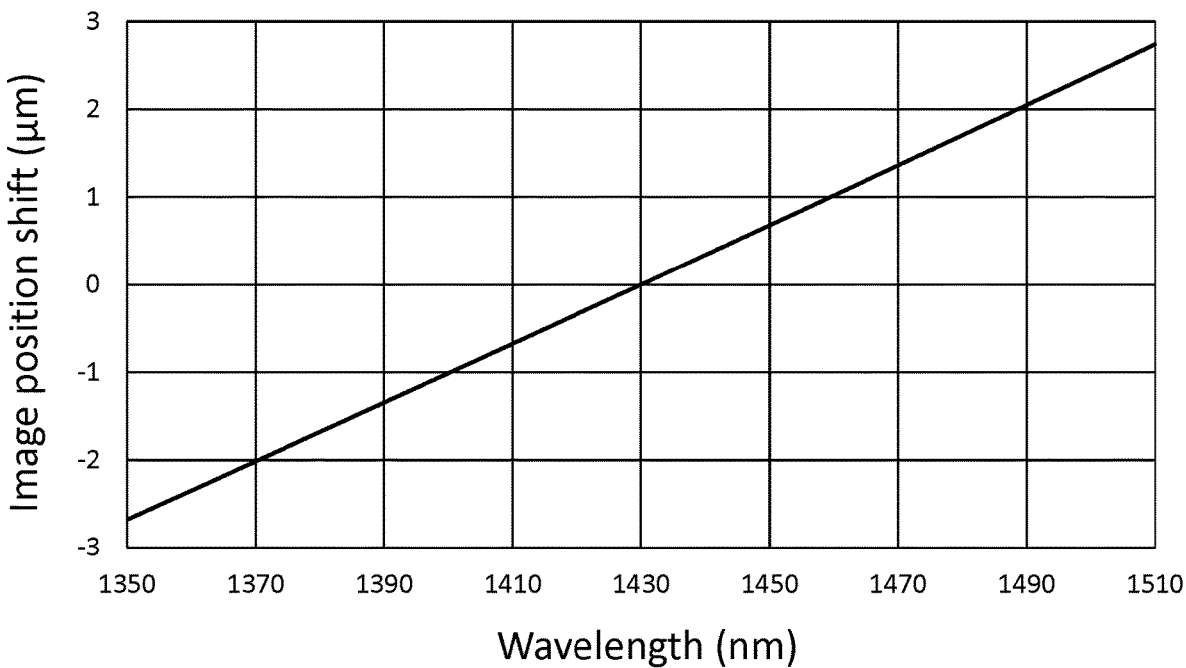
FIG. 17B is a graph showing the longitudinal chromatic aberration of the lens system of FIG. 17A as a function of wavelength.

FIG. 17B shows the longitudinal chromatic aberration of the whole lens system on a round-trip over the relevant tuning range. We find a corresponding total round-trip axial chromatism of δz=5.44 μm. Here, the negative chromatism induced by the collimating lens 304 partially compensates for the chromatic aberrations induced by the imaging lens 302.

Figure 18A:
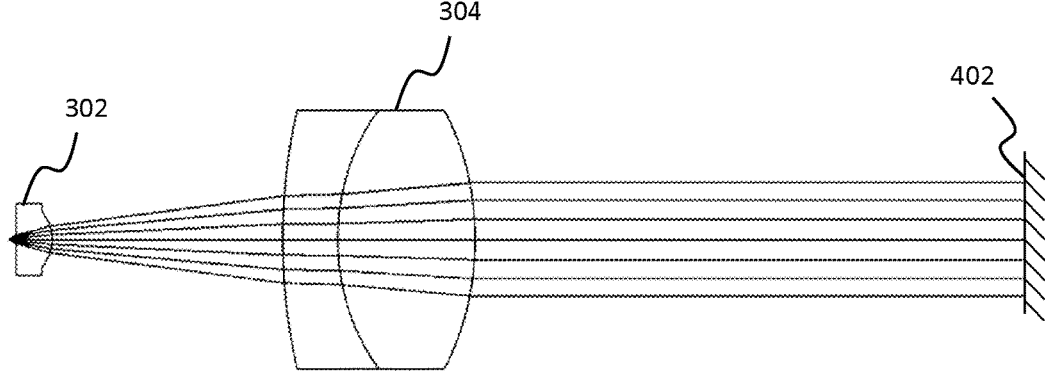
FIG. 18A is a schematic illustrating a chromatic aberration compensation in an external cavity diode laser as shown in FIG. 3, in accordance with another embodiment wherein the imaging lens is embodied as a simple lens producing a virtual image and the collimating lens is embodied as a doublet lens.

FIG. 18A shows an example embodiment wherein the first lens 302 is embodied as a simple converging lens (in the virtual image case) and the second lens 304 is embodied as a doublet lens (here design 2a described above).

In one embodiment, we have:

Imaging lens:

$f_1$=0.697 mm g=3.711

$AXCL_i$=8.23 μm

Collimating lens:

f=8 mm $AXCL_c$=-8.23 μm

Figure 18B:
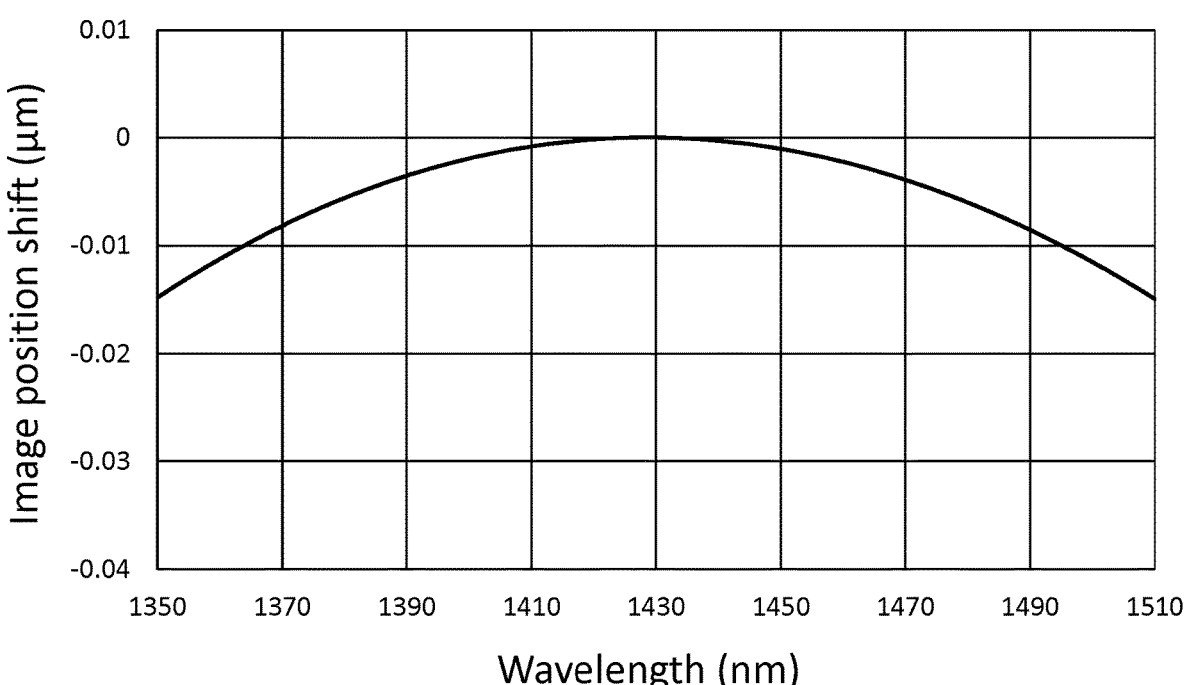
FIG. 18B is a graph showing the longitudinal chromatic aberration of the lens system of FIG. 18A as a function of wavelength.

FIG. 18B shows the longitudinal chromatic aberration of the whole lens system on a round-trip over the relevant tuning range. We find a corresponding total round-trip axial chromatism of δz=0.015 μm. Here, the negative chromatism induced by the collimating lens 304 almost perfectly compensates for the chromatic aberrations induced by the imaging lens 302. Only residual second-order contribution is present.

Figure 19A:
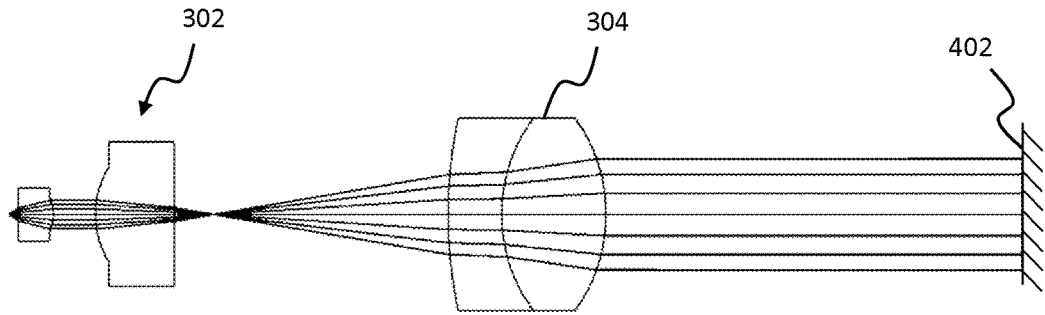
FIG. 19A is a schematic illustrating a chromatic aberration compensation in an external cavity diode laser as shown in FIG. 3, in accordance with another embodiment wherein the imaging lens is embodied as a dual-lens system producing a real image and the collimating lens is embodied as a doublet lens.

FIG. 19A shows an example embodiment wherein the first lens 302 is embodied as a combination of two commercially available convergent aspheric lenses (in the real image case) and the second lens 304 is embodied as a doublet lens (here design 1 described above).

In one embodiment, we have:

Imaging lens (dual-lens system):

$f_1$=0.596 mm $f_2$=2.039 mm g=-3.421

$AXCL_i$=17.16 μm

Collimating lens:

f=8 mm $AXCL_c$=-16.02 μm

Figure 19B:
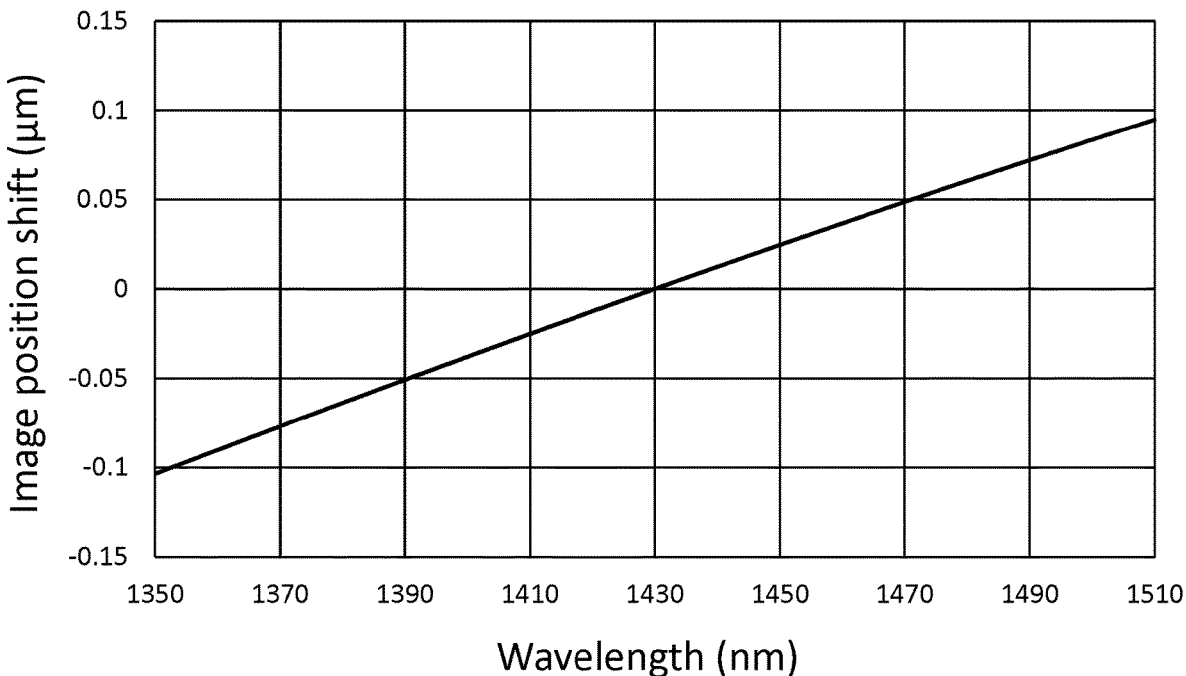
FIG. 19B is a graph showing the longitudinal chromatic aberration of the lens system of FIG. 19A as a function of wavelength.

FIG. 19B shows the longitudinal chromatic aberration of the whole lens system on a round-trip over the relevant tuning range. We find a corresponding total round-trip axial chromatism of δz=0.1984 μm. The negative chromatism induced by the collimating lens 304 almost fully compensates for the chromatic aberrations induced by the imaging lens combination.

Figure 20A:
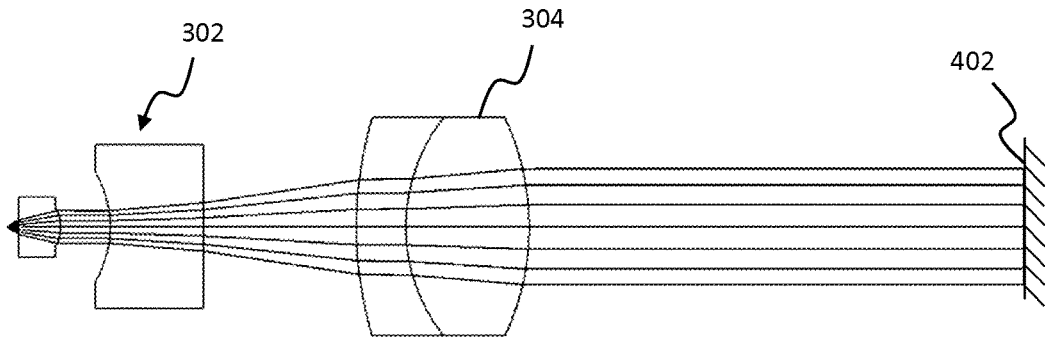
FIG. 20A is a schematic illustrating a chromatic aberration compensation in an external cavity diode laser as shown in FIG. 3, in accordance with another embodiment wherein the imaging lens is embodied as a dual-lens system producing a virtual image and the collimating lens is embodied as a doublet lens.

FIG. 20A shows an example embodiment wherein the first lens 302 is embodied as a combination of two lenses (in the virtual image case) and the second lens 304 is embodied as a doublet lens (here design 2b described above).

In one embodiment, we have:

Imaging lens (dual-lens system):

$f_1$=0.596 mm $f_2$=2.212 mm g=3.711

$AXCL_i$=7.34 μm

Collimating lens:

f=8 mm $AXCL_c$=-7.35 μm

Figure 20B:
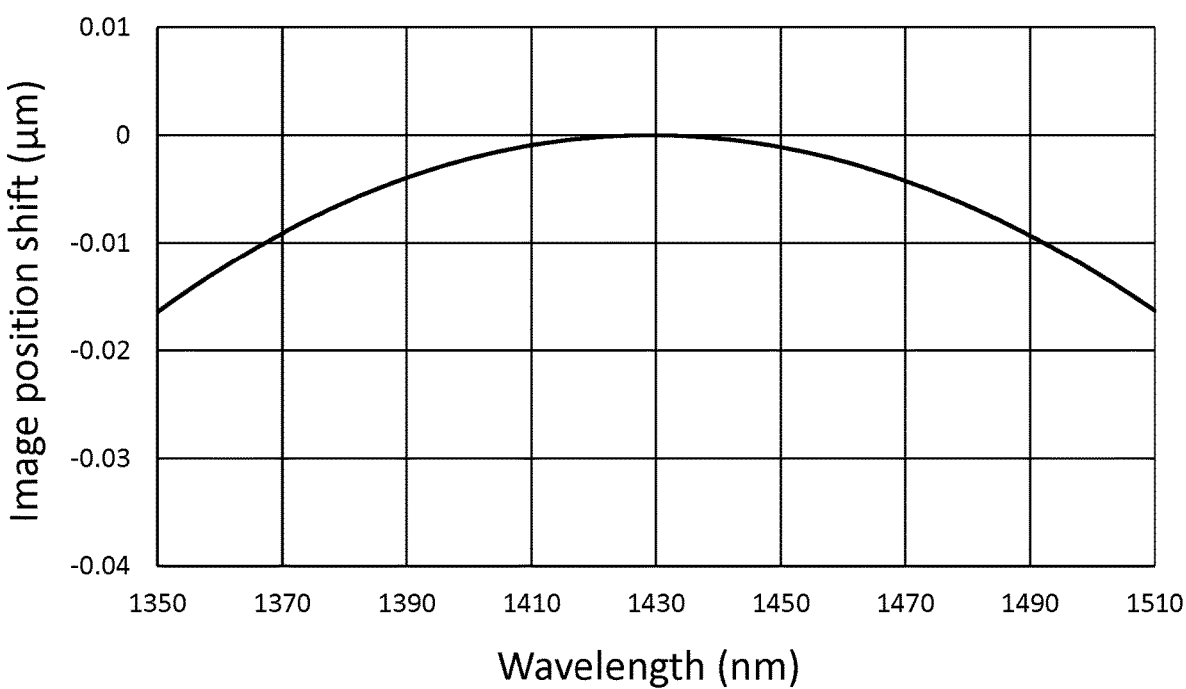
FIG. 20B is a graph showing the longitudinal chromatic aberration of the lens system of FIG. 20A as a function of wavelength.

FIG. 20B shows the longitudinal chromatic aberration of the whole lens system on a round-trip over the relevant tuning range. We find a corresponding total round-trip axial chromatism of δz=0.0164 μm. Again, the negative chromatism induced by the collimating lens 304 almost perfectly compensates for the chromatic aberrations induced by the imaging lens combination.

The embodiments described above are intended to be exemplary only and one skilled in the art will recognize that numerous modifications can be made to these embodiments without departing from the scope of the invention. For example, the specific embodiments described above have been designed for a laser diode chip in which the emitted optical beam has only a relatively small divergence asymmetry (ratio typically less than 2 between the most divergent principal axis and the other one). In such conditions, spherical lenses (rotationally symmetrical) may be used because after collimation the transverse dissymmetry on the beam size remains relatively small. On the other hand, there exist laser diode chips (such as those based on quantum dots for example) which exhibit a much greater divergence asymmetry of the emitted optical beam (ratio ranging for example between 5 and 8). In such cases, in order to circularize the beam, it may be necessary to dissociate the collimating optics along the two transverse axes by using different cylindrical optics for each axis. In such conditions, in order to minimize the axial chromatism on a roundtrip in the cavity, it may be possible to generalize the described configurations by using cylindrical or a cylindrical optics. Chromatic compensation may require the use of distinct lenses for each of the two transverse axes, thereby doubling the number of lenses. This can make the design of an achromatic optical system complex, notably because the behaviors along the two axes are not independent (a cylindrical optic in one axis is equivalent to an optical plate with parallel faces in the other axis and thus also has an effect on the geometric and chromatic aberrations in this other axis).

The embodiments described above are intended to be exemplary only. The scope of the invention is therefore intended to be limited solely by the appended claims.

The invention claimed is:

1. A tunable laser source based on a tunable external-cavity laser, the tunable laser source comprising:

two reflective surfaces to form a laser cavity therebetween;

an active waveguide for amplifying laser light propagating in the laser cavity;

a tunable wavelength-selective filter within the laser cavity for selecting the emission wavelength of the tunable external-cavity laser within a tuning range;

a collimating lens system for collimating the optical beam out of the active waveguide for propagation in the laser cavity;

wherein said collimating lens system comprises:

an imaging lens defining an image plane, said imaging lens inducing a positive chromatism within said tuning range; and a collimating lens for collimating the optical beam coming from the image plane, said collimating lens comprising a complex lens inducing a negative chromatism within said tuning range so as to at least partially compensate for the positive chromatism induced by the imaging lens, wherein said collimating lens comprises a doublet lens having a first converging lens element made of a first material having a first constringence and a second diverging lens element made of a second material having a second constringence, wherein a value of said first constringence is greater than that of said second constringence.

2. The tunable laser source as claimed in claim 1, wherein the active waveguide comprises a laser diode chip.

3. The tunable laser source as claimed in claim 2, wherein the two reflective surfaces comprise a reflective end-face of the laser diode chip and an additional mirror.

4. The tunable laser source as claimed in claim 1, wherein the tunable wavelength-selective filter comprises a diffraction grating.

5. The tunable laser source as claimed in claim 4, wherein the external cavity is configured in a Littman-Metcalf configuration.

6. The tunable laser source as claimed in claim 4, wherein the external cavity is configured in a Littrow configuration.

7. The tunable laser source as claimed in claim 1, further comprising an optical beam-splitter for extracting a portion of laser light out of the laser cavity.

8. The tunable laser source as claimed in claim 7, further comprising a coupling lens system for coupling the extracted portion of laser out to an output optical fiber, wherein said coupling lens system is substantially achromatic within said tuning range.

9. The tunable laser source as claimed in claim 7, further comprising a coupling lens system for coupling the extracted portion of laser out to an output optical fiber, wherein said coupling lens system induces a negative chromatism within said tuning range so as to at least partially compensate for a residual positive chromatism of the collimating lens system.

10. The tunable laser source as claimed in claim 1, wherein said imaging lens produces a real image.

11. The tunable laser source as claimed in claim 1, wherein said imaging lens produces a virtual image.

12. The tunable laser source as claimed in claim 1, wherein said imaging lens comprises a dual-lens system.

13. A tunable external-cavity laser comprising:
two reflective surfaces to form a laser cavity therebe-tween;

an active waveguide for amplifying laser light propagating in the laser cavity;
a tunable wavelength-selective filter within the laser cavity for selecting the emission wavelength of the tunable external-cavity laser within a tuning range; and
a collimating lens system for collimating the optical beam out of the active waveguide for propagation in the laser cavity;
wherein said collimating lens system comprises:
an imaging lens defining an image plane, said imaging lens inducing a positive chromatism within said tuning range; and
a collimating lens for collimating the optical beam coming from the image plane, said collimating lens comprising a complex lens inducting a negative chromatism within said tuning range so as to at least partially compensate for the positive chromatism induced by the imaging lens, wherein said collimating lens comprises a doublet lens having a first converging lens element made of a first material having a first constringence and a second diverging lens element made of a second material having a second constringence, wherein a value of said first constringence is greater than that of said second constringence.

14. The tunable external-cavity laser as claimed in claim 13, wherein the active waveguide comprises a laser diode chip.

15. The tunable external-cavity laser as claimed in claim 14, wherein the two reflective surfaces comprise a reflective end-face of the laser diode chip and an additional mirror.

16. The tunable external-cavity laser as claimed in claim 13, wherein the tunable wavelength-selective filter comprises a diffraction grating.

17. The tunable external-cavity laser as claimed in claim 16, wherein the external cavity is configured in a Littman-Metcalf configuration.

18. The tunable external-cavity laser as claimed in claim 16, wherein the external cavity is configured in a Littrow configuration.

* * * * *